United States Patent
Utsumi et al.

(10) Patent No.: US 11,322,593 B2
(45) Date of Patent: May 3, 2022

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Makoto Utsumi, Matsumoto (JP); Tsuyoshi Araoka, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 40 days.

(21) Appl. No.: 16/829,852

(22) Filed: Mar. 25, 2020

(65) Prior Publication Data

US 2020/0343345 A1 Oct. 29, 2020

(30) Foreign Application Priority Data

Apr. 26, 2019 (JP) .............................. JP2019-086373

(51) Int. Cl.
*H01L 29/16* (2006.01)
*H01L 29/423* (2006.01)

(52) U.S. Cl.
CPC ...... *H01L 29/1608* (2013.01); *H01L 29/4236* (2013.01)

(58) Field of Classification Search
CPC .................. H01L 29/1608; H01L 29/4236
(Continued)

(56) References Cited

U.S. PATENT DOCUMENTS

2013/0168701 A1 7/2013 Kiyosawa et al.
2016/0087045 A1* 3/2016 Shimizu .............. H01L 29/7813
257/77

(Continued)

FOREIGN PATENT DOCUMENTS

| JP | 2003-7676 A | 1/2003 |
| JP | 2013-214658 A | 10/2013 |
| WO | 2013/042333 A1 | 3/2013 |

OTHER PUBLICATIONS

Office Action dated Sep. 24, 2019, in corresponding Japanese Patent Application No. 2019-086373.
(Continued)

*Primary Examiner* — Igwe U Anya

(57) ABSTRACT

A silicon carbide semiconductor device includes a silicon carbide semiconductor substrate of a first conductivity type, a first silicon carbide semiconductor layer of the first conductivity type, a second silicon carbide semiconductor layer of a second conductivity type, a first silicon carbide semiconductor region of the first conductivity type, a trench, and a gate electrode on a gate insulating film. Between the gate insulating film and any one among the first silicon carbide semiconductor layer, the second silicon carbide semiconductor layer, and the first silicon carbide semiconductor region is an interface section where a concentration of oxygen varies, the interface section having closer to the gate insulating film than to the any one among the first silicon carbide semiconductor layer, the second silicon carbide semiconductor layer, and the first silicon carbide semiconductor region, a region where a rate of increase of the oxygen included in the interface section is greatest.

4 Claims, 15 Drawing Sheets

(58) Field of Classification Search
USPC ............................................................ 257/77
See application file for complete search history.

(56) References Cited

U.S. PATENT DOCUMENTS

| | | | | |
|---|---|---|---|---|
| 2016/0126092 | A1* | 5/2016 | Makifuchi | .......... H01L 29/1608 |
| | | | | 257/77 |
| 2017/0200787 | A1* | 7/2017 | Shimizu | ................ H01L 29/872 |
| 2018/0097069 | A1* | 4/2018 | Utsumi | ............... H01L 29/7813 |

OTHER PUBLICATIONS

Office Action dated Sep. 13, 2019, in corresponding Japanese Patent Application No. 2019-086373.

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2019-086373, filed on Apr. 26, 2019, the entire contents of which are incorporated herein by reference.

BACKGROUND

1. Field

Embodiments of the invention relate to a silicon carbide semiconductor device and a method of manufacturing a silicon carbide semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials that have a bandgap wider than that of silicon (hereinafter, wide bandgap semiconductor material) such as gallium nitride (GaN). Therefore, use of a wide bandgap semiconductor material enables realization of high-voltage semiconductor devices.

FIG. 14 is a cross-sectional view of a structure of a conventional silicon carbide semiconductor device. As depicted in FIG. 14, a MOS gate having a general trench gate structure is provided at a front side (side having a p-type silicon carbide epitaxial layer 103) of a semiconductor base (hereinafter, silicon carbide semiconductor base) containing silicon carbide. In the silicon carbide semiconductor base (semiconductor chip), silicon carbide layers respectively forming an n-type silicon carbide epitaxial layer 102, an n-type high-concentration region 106 that is a current spreading region, and the p-type silicon carbide epitaxial layer 103 are formed sequentially by epitaxial growth on an $n^+$-type support substrate (hereinafter, $n^+$-type silicon carbide substrate) 101 containing silicon carbide.

In the n-type high-concentration region 106, first $p^+$-type base regions 104 are selectively provided between (mesa portion) trenches 118 that are adjacent to one another. The first $p^+$-type base regions 104 are provided so as to be in contact with the p-type silicon carbide epitaxial layer 103. Further, in the n-type high-concentration region 106, second $p^+$-type base regions 105 are selectively provided so that each partially covers a bottom of a corresponding one of the trenches 118. The second $p^+$-type base regions 105 are provided at a depth not reaching the n-type silicon carbide epitaxial layer 102. The second $p^+$-type base regions 105 and the first $p^+$-type base regions 104 may be formed concurrently.

Reference numerals 107 to 111, 113, and 115 are an $n^+$-type source region, a $p^+$-type contact region, a gate insulating film, a gate electrode, an interlayer insulating film, a source electrode, and source electrode pad, respectively. On a back side of the $n^+$-type silicon carbide substrate 101, a back electrode 114 is provided.

Here, formation of the trenches 118 in a rounded shape in which the bottoms of the trenches 118 are rounded to increase a withstand voltage of the gate insulating film 109 is commonly known (for example, refer to Japanese Laid-Open Patent Publication No. 2003-7676).

SUMMARY

According to an embodiment of the invention, a silicon carbide semiconductor device includes a silicon carbide semiconductor substrate of a first conductivity type, having a front surface and a back surface opposite to the front surface; a first silicon carbide semiconductor layer of the first conductivity type, provided on the front surface of the silicon carbide semiconductor substrate and having an impurity concentration that is lower than an impurity concentration of the silicon carbide semiconductor substrate, the first silicon carbide semiconductor layer having a first side and a second side opposite to the first side and facing the silicon carbide semiconductor substrate; a second silicon carbide semiconductor layer of a second conductivity type, selectively provided on a surface of the first side of the first silicon carbide semiconductor layer, the second silicon carbide semiconductor layer having a first side and a second side opposite to the first side thereof and facing the silicon carbide semiconductor substrate, the second silicon carbide semiconductor layer further having a surface layer at the first side thereof; a first silicon carbide semiconductor region of the first conductivity type, selectively provided in the surface layer of the second silicon carbide semiconductor layer; a trench that penetrates the second silicon carbide semiconductor layer and the first silicon carbide semiconductor region, and reaches the first silicon carbide semiconductor layer; a gate insulating film provided in the trench; a gate electrode provided in the trench, on the gate insulating film; an interlayer insulating film formed on the gate electrode; a first electrode electrically connected to the first silicon carbide semiconductor region and the second silicon carbide semiconductor layer; and a second electrode provided at the back surface of the silicon carbide semiconductor substrate. Between the gate insulating film and any one among the first silicon carbide semiconductor layer, the second silicon carbide semiconductor layer, and the first silicon carbide semiconductor region is an interface section where a concentration of oxygen varies, the interface section having a region where a rate of increase of the oxygen included in the interface section is greatest, the region being closer to the gate insulating film than to the any one among the first silicon carbide semiconductor layer, the second silicon carbide semiconductor layer, and the first silicon carbide semiconductor region.

In the embodiment, a region portion where the rate of increase of the oxygen included in the interface section is increasing is larger than a region portion where the rate of increase of the oxygen is decreasing.

In the embodiment, the interface section has width that is at most 2 nm.

According to another embodiment of the invention, a method of manufacturing a silicon carbide semiconductor device includes forming a first silicon carbide semiconductor layer of a first conductivity type, on a front surface of a silicon carbide semiconductor substrate of the first conductivity type, the first silicon carbide semiconductor layer having an impurity concentration that is lower than an impurity concentration of the silicon carbide semiconductor substrate, the first silicon carbide semiconductor layer further having a first side and a second side opposite to the first side and facing the silicon carbide semiconductor substrate; selectively forming a second silicon carbide semiconductor layer of a second conductivity type, on a surface of the first side of the first silicon carbide semiconductor layer, the second silicon carbide semiconductor layer having a first side and a second side opposite to the first side thereof and facing the silicon carbide semiconductor substrate; selectively forming a first silicon carbide semiconductor region of the first conductivity type, in a surface layer of the first side the second silicon carbide semiconductor layer; forming a trench that penetrates the second silicon carbide semiconductor layer and the first silicon carbide semiconductor region, and reaches the first silicon carbide semiconductor layer; performing a hydrogen annealing treatment at a temperature of at least 1500 degrees C. to the trench; performing a hydrogen etching process at a temperature in a range from 1300 degrees C. to less than 1500 degrees C., the hydrogen etching process being performed to the trench after the hydrogen annealing treatment; forming a gate insulating film in the trench; forming a gate electrode on the gate insulating film in the trench; forming an interlayer insulating film that covers the gate electrode; forming a first electrode that is electrically connected to the first silicon carbide semiconductor region and the second silicon carbide semiconductor layer; and forming a second electrode at a back surface of the silicon carbide semiconductor substrate.

Objects, features, and advantages of the present invention are specifically set forth in or will become apparent from the following detailed description of the invention when read in conjunction with the accompanying drawings.

DETAILED DESCRIPTION OF EMBODIMENTS

Figure 14:
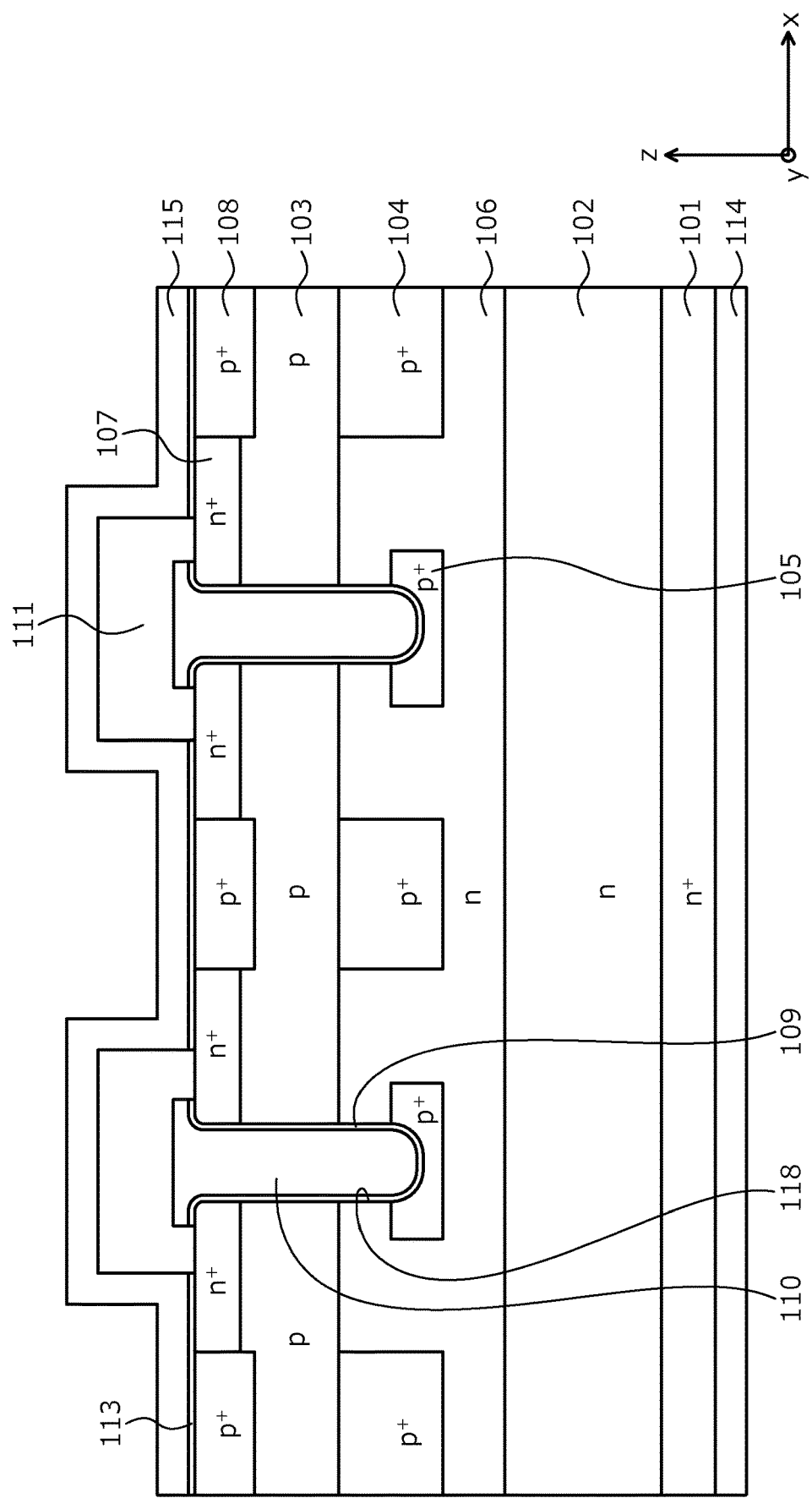
FIG. 14 is a cross-sectional view of a structure of the conventional silicon carbide semiconductor device.

First, problems associated with the conventional techniques will be discussed. Here, in a method of manufacturing the silicon carbide semiconductor device having the trench gate structure depicted in FIG. 14, the n-type silicon carbide epitaxial layer 102, the n-type high-concentration region 106 that is a current spreading region, and the p-type silicon carbide epitaxial layer 103 are sequentially formed on the n$^+$-type silicon carbide substrate 101 by epitaxial growth, and the n$^+$-type source regions 107 and the p$^+$-type contact regions 108 are formed by ion implantation. Thereafter, the trenches 118 are formed.

Figure 15:
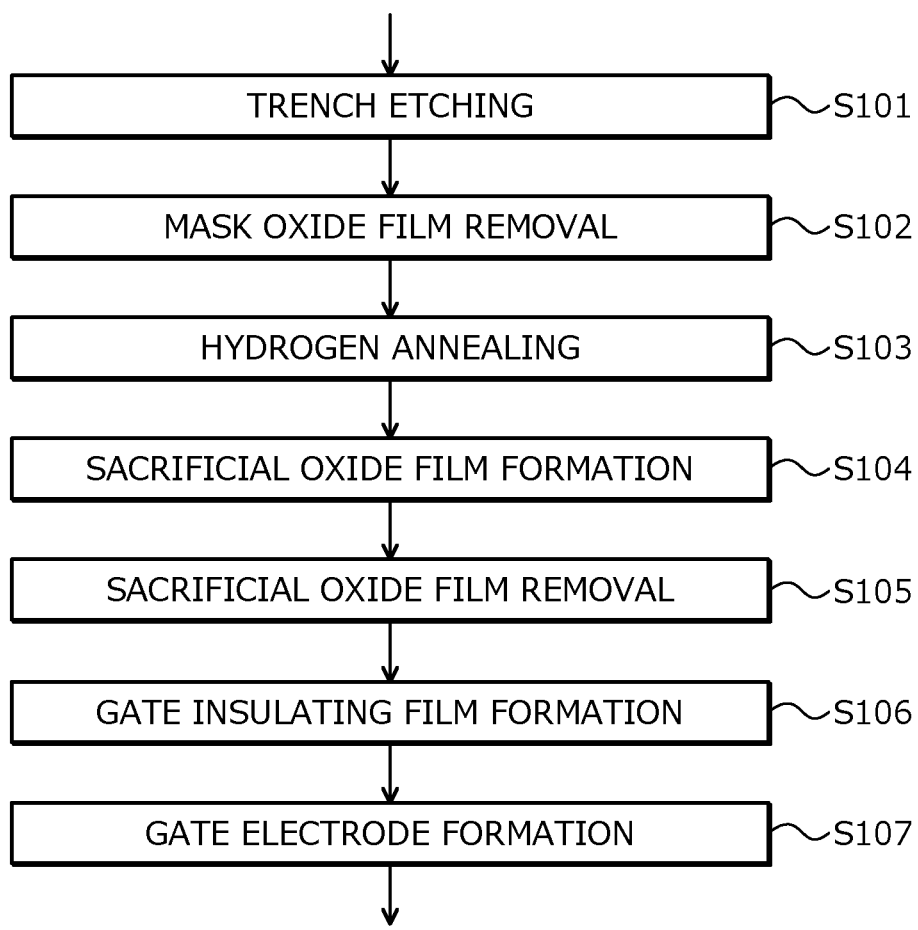
FIG. 15 is a flowchart of a method of manufacturing trenches of the conventional silicon carbide semiconductor device.

FIG. 15 is a flowchart of a method of manufacturing the trenches of the conventional silicon carbide semiconductor device. First, by dry etching, the trenches 118 are formed to penetrate the p-type silicon carbide epitaxial layer 103 and reach the n-type high-concentration region 106 (step S101). Next, a mask oxide film for trench formation is removed (step S102).

Next, hydrogen annealing is performed with respect to the trenches 118 to round corners of the trenches 118 (step S103). For example, by performing annealing in a hydrogen gas atmosphere of at least 1500 degrees C., SiC surface etching and surface diffusion of silicon and carbon (C)

elements occurs concurrently, whereby the rounded shape of the trenches 118 is formed. Here, when the rounded shape is formed, at an interface (channel portion) between the p-type silicon carbide epitaxial layer 103 and the trenches 118, an n-type region is formed. This n-type region becomes a leak point when reverse voltage is applied to the silicon carbide semiconductor device.

Therefore, thermal oxidation is performed and a sacrificial oxide film is formed in the trenches 118 (step S104), and the sacrificial oxide film is removed (step S105), whereby surfaces of the trenches 118 are etched. Next, along the bottoms and side walls of the trenches 118, the gate insulating film 109 is formed (step S106). Next, on the gate insulating film 109, the gate electrodes 110 are formed (step S107). Further, as another technique, low-damage etching using a fluorine (F) based gas may be used.

Nonetheless, in the method of etching the surfaces of the trenches 118 by thermal oxidation, a problem occurs in that resistance of the channel portion increases. Excess carbon occurring during the thermal oxidation is presumed to be a factor causing increases in channel resistance. Further, even in a case of etching using a fluorine-based gas, a similar problem occurs. In this case, the etching randomly advances at the surfaces of the trenches 118, whereby crystal arrangement is disturbed and this disruption is presumed to be a factor causing increases in channel resistance.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
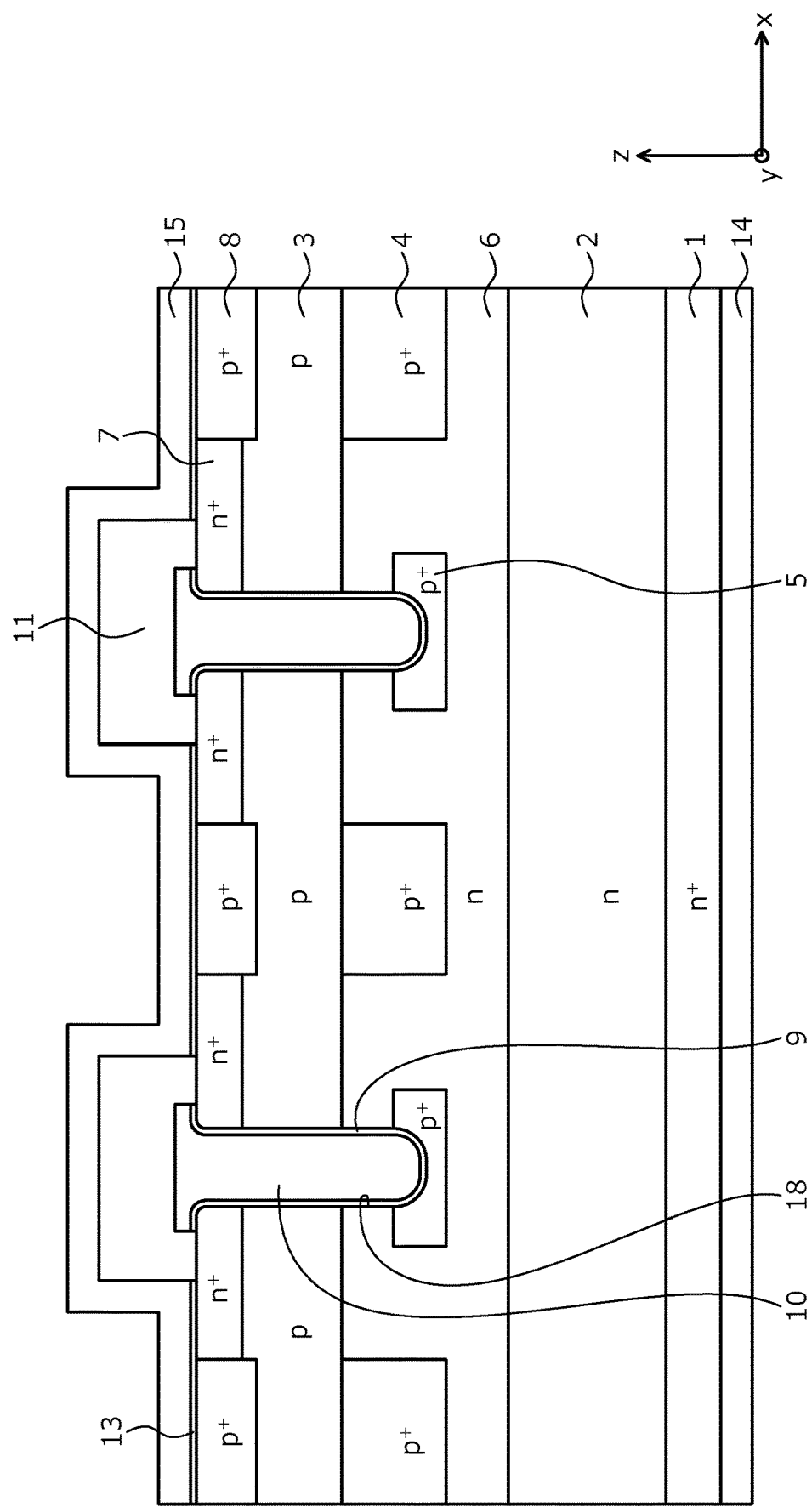
FIG. 1 is a cross-sectional view of a structure of a silicon carbide semiconductor device according to an embodiment.

A semiconductor device according to the present invention contains a wide bandgap semiconductor. In an embodiment, a silicon carbide semiconductor device fabricated using, for example, silicon carbide (SiC) as a wide bandgap semiconductor will be described taking a MOSFET as an example. FIG. 1 is a cross-sectional view of a structure of the silicon carbide semiconductor device according to the embodiment.

As depicted in FIG. 1, the silicon carbide semiconductor device according to the embodiment includes a MOS gate having a general trench gate structure, at a front side (side having a p-type silicon carbide epitaxial layer 3) of a semiconductor base (hereinafter, silicon carbide semiconductor base) containing silicon carbide. In the silicon carbide semiconductor base (semiconductor chip), silicon carbide layers that respectively form an n-type silicon carbide epitaxial layer 2, an n-type high-concentration region 6 that is a current spreading region, and the p-type silicon carbide epitaxial layer 3 are sequentially formed by epitaxial growth on an n$^+$-type support substrate (hereinafter, n$^+$-type silicon carbide substrate) 1 containing silicon carbide.

On a first main surface (front surface), for example, a (0001) plane (Si-face), of the n$^+$-type silicon carbide substrate (silicon carbide semiconductor substrate of a first conductivity type) 1, an n-type silicon carbide epitaxial layer (first silicon carbide semiconductor layer of the first conductivity type) 2 is deposited. The n$^+$-type silicon carbide substrate 1 is a silicon carbide single crystal substrate doped with, for example, nitrogen (N). The n-type silicon carbide epitaxial layer 2 is a low-concentration n-type drift layer doped with, for example, nitrogen and has an impurity concentration that is lower than an impurity concentration of the n$^+$-type silicon carbide substrate 1. At surface of a first side of the n-type silicon carbide epitaxial layer 2, opposite a second side of the n-type silicon carbide epitaxial layer 2 facing the n$^+$-type silicon carbide substrate 1, the n-type high-concentration region 6 may be formed. The n-type high-concentration region 6 is a high-concentration n-type drift layer doped with, for example, nitrogen and has an impurity concentration that is lower than the impurity concentration of the n$^+$-type silicon carbide substrate 1 and higher than the impurity concentration of the n-type silicon carbide epitaxial layer 2. Hereinafter, the n$^+$-type silicon carbide substrate 1, the n-type silicon carbide epitaxial layer 2, the n-type high-concentration region 6, and a p-type silicon carbide epitaxial layer (second silicon carbide semiconductor layer of a second conductivity type) 3 described hereinafter are regarded collectively as the silicon carbide semiconductor base.

As depicted in FIG. 1, at a second main surface (back surface, i.e., back surface of the silicon carbide semiconductor base) of the n$^+$-type silicon carbide substrate 1, a back electrode (second electrode) 14 is provided. The back electrode 14 configures a drain electrode. At a surface of the back electrode 14, a drain electrode pad (not depicted) is provided.

At a first main side (side having the p-type silicon carbide epitaxial layer 3) of the silicon carbide semiconductor base, a trench structure having a stripe shape is formed. In particular, trenches 18 that each penetrate the p-type silicon carbide epitaxial layer 3 and reach the n-type high-concentration region 6 (in a case where the n-type high-concentration region 6 is not provided, the n-type silicon carbide epitaxial layer 2, hereinafter simply "(2)") are provided, the trenches 18 each penetrating the p-type silicon carbide epitaxial layer 3 from a surface of a first side (the first main side of the silicon carbide semiconductor base) of the p-type silicon carbide epitaxial layer 3, opposite a second side of the p-type silicon carbide epitaxial layer 3 facing the n$^+$-type silicon carbide substrate 1. Along inner walls of the trenches 18, a gate insulating film 9 is formed along bottoms and side walls of the trenches 18; and gate electrodes 10 each having a stripe shape are formed on the gate insulating film 9 in the trenches 18, respectively. The gate electrodes 10 are insulated from the n-type high-concentration region 6 (2) and the p-type silicon carbide epitaxial layer 3 by the gate insulating film 9. A portion of each of the gate electrodes 10 may protrude toward a source electrode pad 15, from a top (side toward the source electrode pad 15) of the trenches 18.

In a surface layer of the n-type high-concentration region 6 (2), the surface layer of a first side (the first main side of the silicon carbide semiconductor base) of the n-type high-concentration region 6 (2), opposite to a second side of the n-type high-concentration region 6 (2) facing the n$^+$-type silicon carbide substrate 1, first p$^+$-type base regions 4 are selectively provided and in the n-type high-concentration region 6 (2), second p$^+$-type base regions 5 are selectively provided. The second p$^+$-type base regions 5 are formed beneath the trenches 18, respectively and a width of each of the second p+-type base regions 5 is greater than a width of each of the trenches 18. The first p+-type base regions 4 and the second p+-type base regions 5 are doped with, for example, aluminum (Al).

A portion of each of the first p+-type base regions 4 may extend toward the trenches 18 to be connected to the second p+-type base regions 5. In this case, the first p+-type base regions 4 may have a planar layout in which the portions thereof are disposed to repeatedly alternate with the n-type high-concentration region 6 (2), in a direction (hereinafter, the second direction) y orthogonal to a direction (hereinafter, first direction) x in which the first p+-type base regions 4 and the second p+-type base regions 5 are arranged. For example, a structure in which a portion of each of the first p+-type base regions 4 extends toward each of the trenches 18 sandwiching the portion in the first direction x and is connected to a portion of the second p+-type base regions 5 adjacent thereto may be disposed periodically in the second direction y. A reason for this is that holes generated when avalanche breakdown occurs at junction portions between the second p+-type base regions 5 and the n-type silicon carbide epitaxial layer 2 are efficiently migrated to source electrodes (first electrodes) 13, whereby load to the gate insulating film 9 is decreased and reliability is increased.

At a base first main side of the n-type high-concentration region 6 (2), the p-type silicon carbide epitaxial layer 3 is provided. In a surface layer of the p-type silicon carbide epitaxial layer 3, at a base first main side of the p-type silicon carbide epitaxial layer 3, n+-type source regions (first silicon carbide semiconductor regions of the first conductivity type) 7 are selectively provided. In the surface layer of the p-type silicon carbide epitaxial layer 3, p+-type contact regions 8 may be selectively provided. The n+-type source regions 7 are in contact with the trenches 18. Further, the n+-type source regions 7 and the p+-type contact regions 8 are in contact with one another. Further, in a surface layer of a base first main side of the n-type silicon carbide epitaxial layer 2, in regions thereof sandwiched between the first p+-type base regions 4 and the second p+-type base regions 5, and in regions sandwiched between the p-type silicon carbide epitaxial layer 3 and the second p+-type base regions 5, the n-type high-concentration region 6 may be provided.

In FIG. 1, while only two trench MOS structures are depicted, MOS gate (insulated gate formed by a metal, an oxide film, and a semiconductor) structures having a trench structure may be further disposed in parallel.

An interlayer insulating film 11 is provided on an entire surface of the first main side of the silicon carbide semiconductor base so as to cover the gate electrodes 10 respectively embedded in the trenches 18. The source electrodes 13 are in contact with the n+-type source regions 7 via contact holes opened in the interlayer insulating film 11. In a case where the p+-type contact regions 8 are provided, the source electrodes 13 are in contact with the n+-type source regions 7 and the p+-type contact regions 8. The source electrodes 13 are electrically insulated from the gate electrodes 10 by the interlayer insulating film 11. On the source electrodes 13, the source electrode pad 15 is provided. Between the source electrodes 13 and the interlayer insulating film 11, for example, a barrier metal (not depicted) in which titanium and titanium nitride are stacked and that prevents diffusion of metal atoms from the source electrodes 13 to the gate electrodes 10 may be provided.

Figure 2:
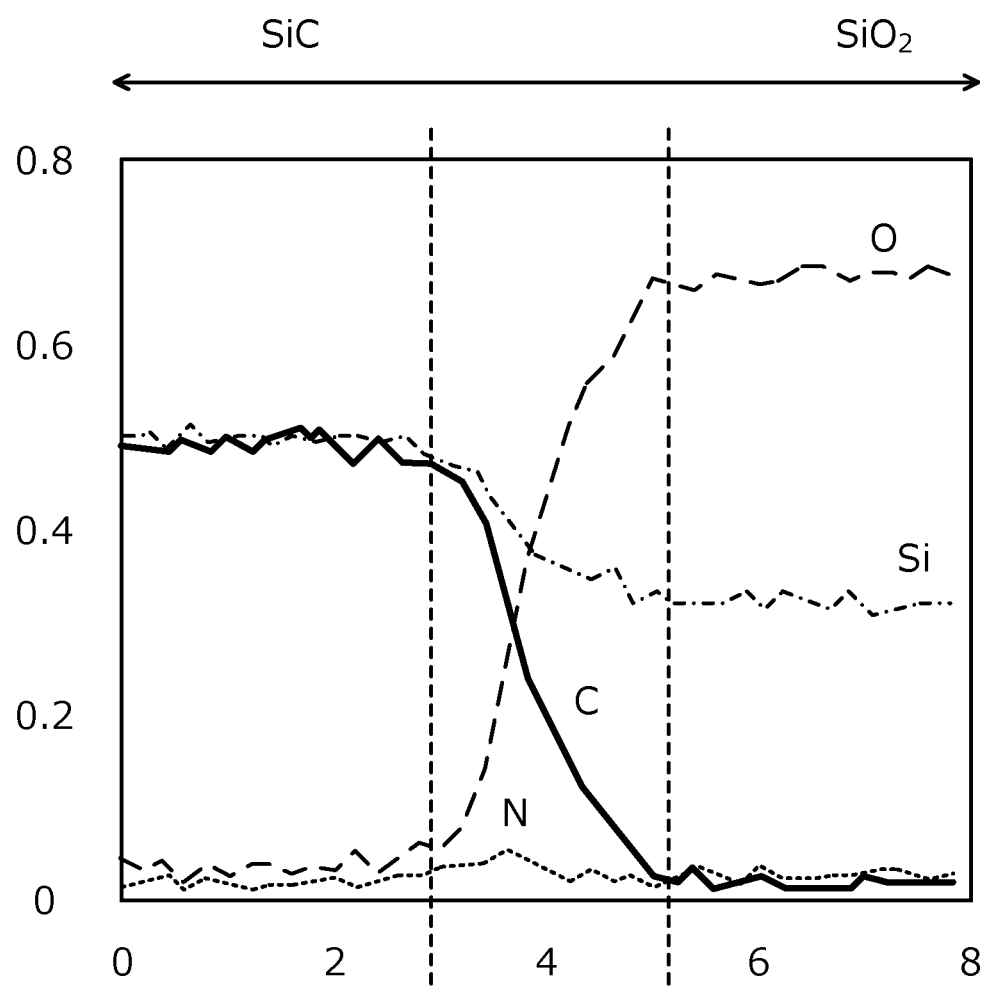
FIG. 2 is a graph depicting element detection ratios at a SiC/SiO$_2$ interface of a conventional silicon carbide semiconductor device.
Figure 3:
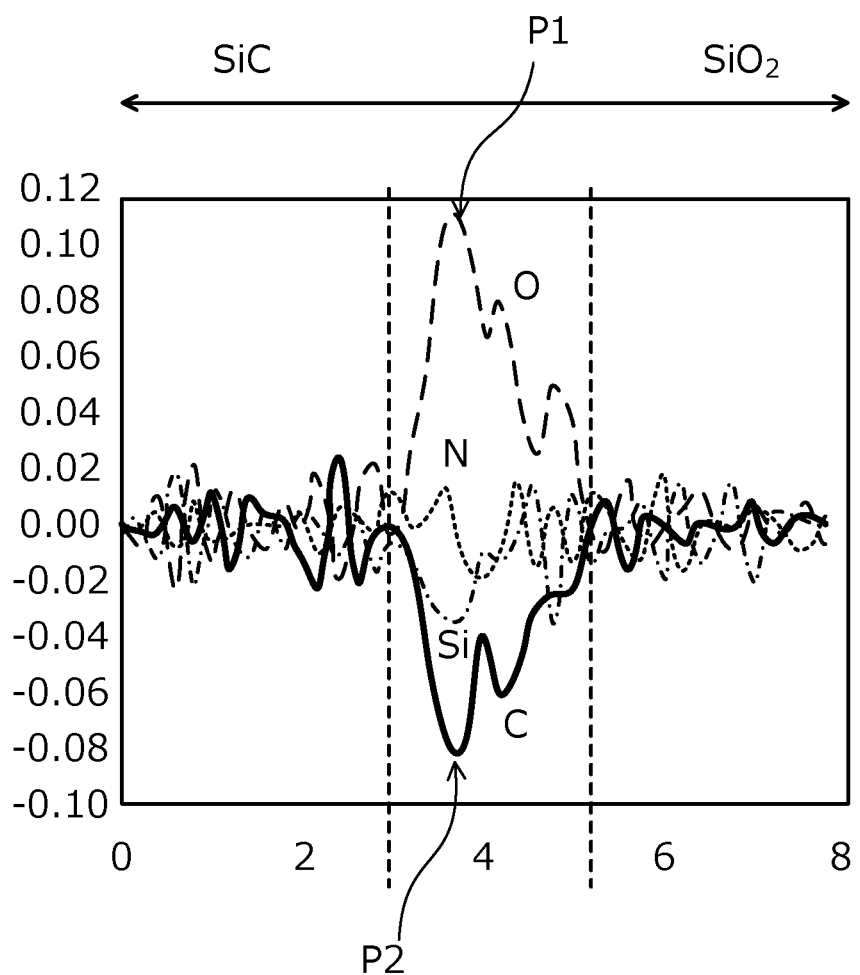
FIG. 3 is a graph depicting rates of element increase at the SiC/SiO$_2$ interface of the conventional silicon carbide semiconductor device.

FIG. 2 is a graph depicting element detection ratios at a SiC/SiO$_2$ interface of the conventional silicon carbide semiconductor device. FIG. 3 is a graph depicting rates of element increase at the SiC/SiO$_2$ interface of the conventional silicon carbide semiconductor device. Here, FIGS. 2 and 3 depict results of a silicon carbide semiconductor device having the trenches 118, where after the trenches 118 are formed, a hydrogen annealing treatment is performed and thereafter, a sacrificial oxide film is formed, and the sacrificial oxide film is removed.

Figure 4:
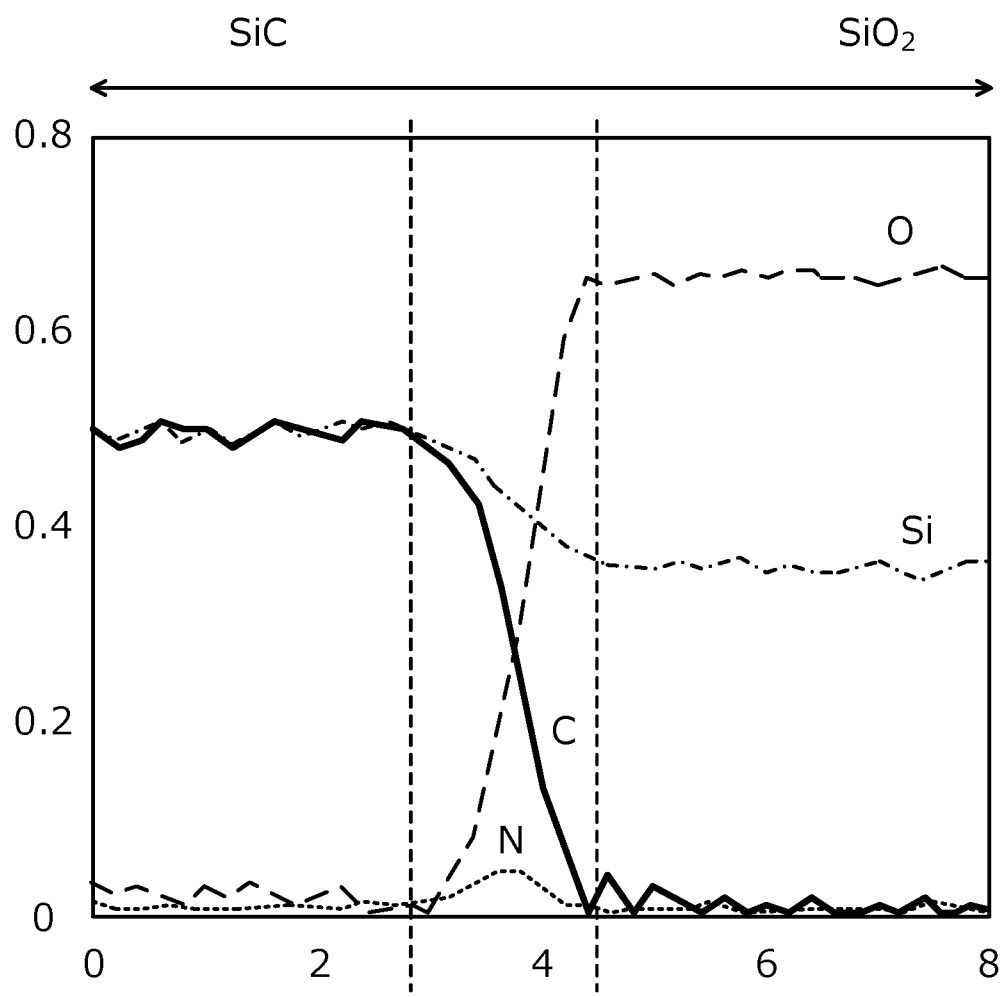
FIG. 4 is a graph depicting element detection ratios at a SiC/SiO$_2$ interface of the silicon carbide semiconductor device according to the embodiment.
Figure 5:
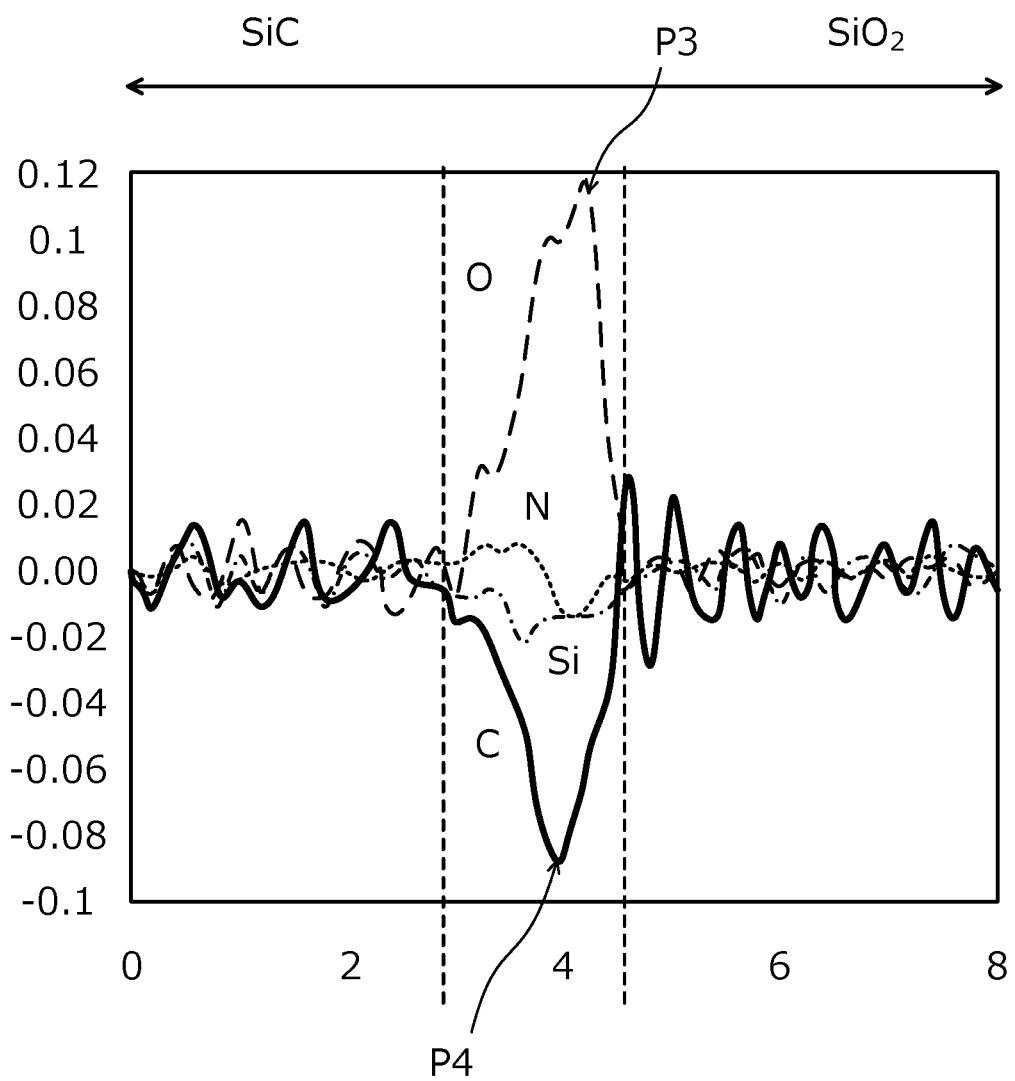
FIG. 5 is a graph depicting rates of element increase at the SiC/SiO$_2$ interface of the silicon carbide semiconductor device according to the embodiment.

Further, FIG. 4 is a graph depicting element detection ratios at a SiC/SiO$_2$ interface of the silicon carbide semiconductor device according to the embodiment. FIG. 5 is a graph depicting rates of element increase at the SiC/SiO$_2$ interface of the silicon carbide semiconductor device according to the embodiment. While described in detail with a method of manufacturing of the embodiment, here, FIGS. 4 and 5 depict results for a silicon carbide semiconductor device having the trenches 18, where after the trenches 18 are formed, the hydrogen annealing treatment is performed, and thereafter, a hydrogen etching process is performed.

In the description of the drawings below, when drawings related to the silicon carbide semiconductor device according to the embodiment (FIG. 1) and the conventional silicon carbide semiconductor device (FIG. 14) are described, only reference numerals of the silicon carbide semiconductor device according to the embodiment will be indicated.

FIGS. 2 and 4 depict element detection ratios of an interface between the gate insulating film 9 containing SiO$_2$ and a silicon carbide semiconductor (any among the second p+-type base regions 5, the n-type high-concentration region 6, the p-type silicon carbide epitaxial layer 3, the n+-type source regions 7) that are in a direction (x-axis direction in FIG. 1) parallel to the front surface of the n+-type silicon carbide substrate 1 and in contact with the trenches 18. Each depicts detection results by TEM-EELS that is a combination of transmission electron microscopy (TEM) and electron energy-loss spectroscopy (EELS).

In FIGS. 2 to 5, a horizontal axis indicates positions in the gate insulating film 9 from inside the silicon carbide semiconductor, in units of nm. In FIGS. 2 and 4, a vertical axis indicates detection ratios of each element (oxygen (O), silicon (Si), carbon (C), nitrogen (N)), in units of at % (atomic percentage). Further, in FIGS. 3 and 5, a vertical axis indicates a rate of increase for each element; and in particular, are results of differentiating respective graphs of FIGS. 2 and 4 by position. For example, in a case of oxygen, when the detection ratio of oxygen at position x is assumed to be O(x), the rate of increase of oxygen is dO(x)/dx.

Here, as depicted in FIG. 3, in the conventional silicon carbide semiconductor device, at an interface between the gate insulating film 109 and a silicon carbide semiconductor layer, a region P1 where the rate of increase of oxygen is greatest in an interface section is closer to the silicon carbide semiconductor than to the gate insulating film 109. Here, the interface is a face where the gate insulating film 109 and the silicon carbide semiconductor layer are in contact with one another and in particular, is a face where a concentration of oxygen and a concentration of carbon are substantially the same (position where an O curve and a C curve intersect). Further, the interface section is a section where the concentration of oxygen or the concentration of carbon varies. For example, a rate of increase of oxygen or carbon is in a range of at least ±0.02. Further, similarly regarding carbon, in the conventional silicon carbide semiconductor device, at an interface between the gate insulating film 109 and a silicon carbide semiconductor layer, a region P2 where a rate of increase (negative) of carbon is greatest in the interface section is closer to the silicon carbide semiconductor layer than to the gate insulating film 109.

On the other hand, as depicted in FIG. 5, in the silicon carbide semiconductor device of the embodiment, at an interface between the gate insulating film 9 and the silicon carbide semiconductor layer, a region P3 where the rate of increase of oxygen is greatest in the interface section is closer to the gate insulating film 9 than to the silicon carbide semiconductor layer. Similarly regarding carbon, in the silicon carbide semiconductor device of the embodiment, at an interface between the gate insulating film 9 and a silicon carbide semiconductor layer, a region P4 where the rate of increase (negative) of carbon is greatest in the interface section is closer to the gate insulating film 9 than to the silicon carbide semiconductor layer. This is because by the hydrogen etching process, a clean silicon surface is possible at the surfaces of the trenches 18 and therefore, a steep interface is possible.

Further, as depicted in FIG. 2, in the conventional silicon carbide semiconductor device, the detection ratio of oxygen in the interface section has a protruding shape on top because a region $(x:d^2O(x)/dx^2<0)$ where the rate of increase is decreasing is larger than a region $(x:d^2O(x)/dx^2>0)$ where the rate of increase is increasing. Further, the detection ratio of carbon in the interface section has a protruding shape on the bottom because a region where the rate of increase is increasing is larger than a region where the rate of increase is decreasing.

On the other hand, as depicted in FIG. 4, in the silicon carbide semiconductor device of the embodiment, the detection ratio of oxygen in the interface section has a protruding shape at the bottom because a region where the rate of increase is increasing is larger than a region where the rate of increase is decreasing. Further, the detection ratio of carbon in the interface section has a protruding shape on the top because a region where the rate of increase is decreasing is larger than a region where the rate of increase is increasing.

Further, when FIGS. 2 and 4 are compared, in the silicon carbide semiconductor device of the embodiment, the increase and the decrease of the detection ratios of oxygen and carbon are steep. Therefore, a width of the interface section in the silicon carbide semiconductor device of the embodiment is narrower than a width of the interface section in the conventional silicon carbide semiconductor device and, for example, is at most 4 nm.

As described above, according to the silicon carbide semiconductor device according to the embodiment, the trenches are formed by the hydrogen etching process. In the hydrogen etching process, an etching rate is low and therefore, fine etching control of the trench surface is possible. As a result, microprocessing of the trench surface is possible, thereby enabling reduction in the trench width and reduction of a ratio of the trench width to a thickness of the gate insulating film 9.

A method of manufacturing the silicon carbide semiconductor device according to the embodiment will be described. FIGS. 6, 7, 8, 9, 10, 11, and 12 are cross-sectional views of the silicon carbide semiconductor device according to the embodiment during manufacture.

Figure 6:
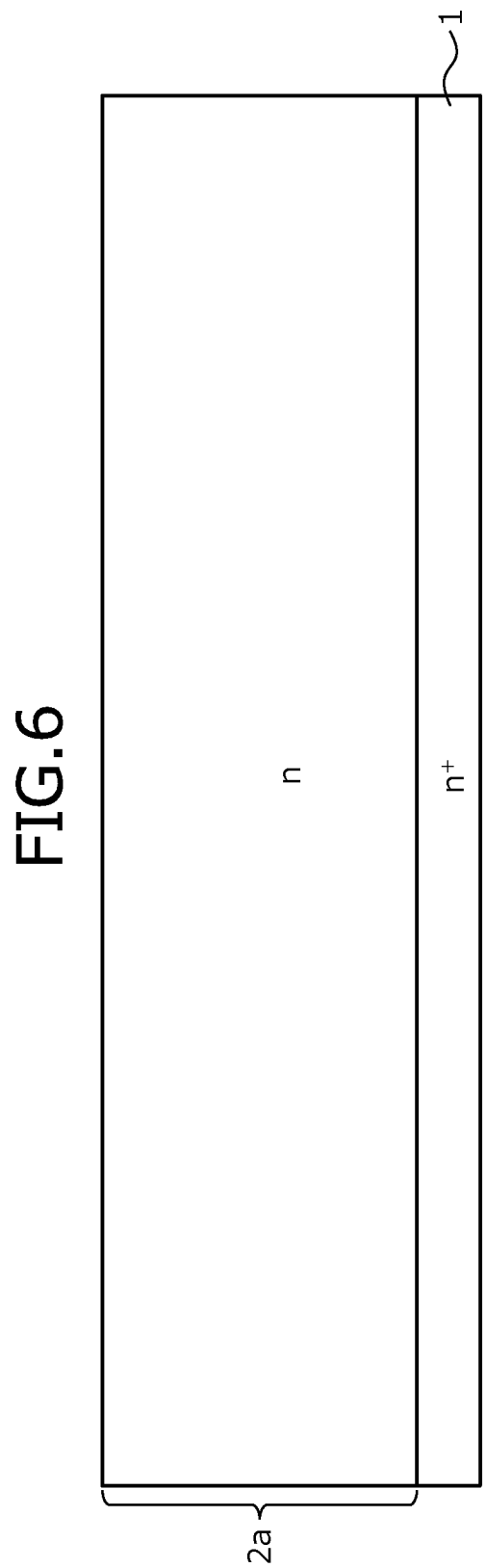
FIG. 6 is a cross-sectional view of the silicon carbide semiconductor device according to the embodiment during manufacture.

First, the n$^+$-type silicon carbide substrate 1 containing an n-type silicon carbide is prepared. Then, on the first main surface of the n$^+$-type silicon carbide substrate 1, a first n-type silicon carbide epitaxial layer 2a containing silicon carbide is formed to have a thickness of, for example, about 30 μm while an n-type impurity, for example, nitrogen atoms, is doped. The first n-type silicon carbide epitaxial layer 2a forms the n-type silicon carbide epitaxial layer 2. The state up to here is depicted in FIG. 6.

Figure 7:
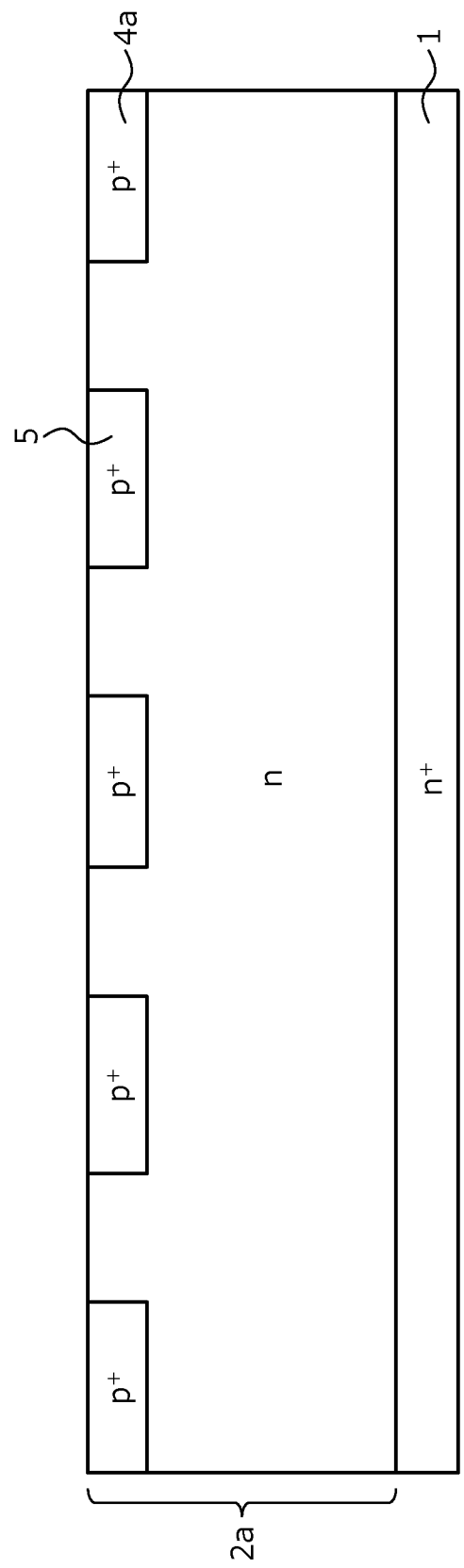
FIG. 7 is a cross-sectional view of the silicon carbide semiconductor device according to the embodiment during manufacture.

Next, on a surface of the first n-type silicon carbide epitaxial layer 2a, by a photolithographic technique, an ion implantation mask having predetermined openings is formed using, for example, an oxide film. Then, a p-type impurity such as aluminum is implanted in the openings of the oxide film, thereby forming lower first p$^+$-type base regions 4a of a depth of about 0.5 μm. Concurrently with the lower first p$^+$-type base regions 4a, the second p$^+$-type base regions 5 forming the bottoms of the trenches 18 may be formed. A distance between one of lower first p$^+$-type base regions 4a and one of the second p$^+$-type base regions 5 adjacent to the one of lower first p$^+$-type base regions 4a is about 1.5 μm. An impurity concentration of the lower first p$^+$-type base regions 4a and the second p$^+$-type base regions 5 is set to, for example, about $5\times10^{18}/cm^3$. The state up to here is depicted in FIG. 7.

Next, portions of the ion implantation mask may be removed and an n-type impurity such as nitrogen may be ion-implanted in the openings, whereby a lower n-type high-concentration region 6a of a depth of, for example, about 0.5 μm may be formed in a portion of a surface region of the first n-type silicon carbide epitaxial layer 2a. An impurity concentration of the lower n-type high-concentration region 6a is set to be, for example, about $1\times10^{17}/cm^3$.

Next, on a surface of the first n-type silicon carbide epitaxial layer 2a, a second n-type silicon carbide epitaxial layer 2b doped with an n-type impurity such as nitrogen is formed to have a thickness of about 0.5 μm. An impurity concentration of the second n-type silicon carbide epitaxial layer 2b is set to be about $3\times10^{15}/cm^3$. Hereinafter, the first n-type silicon carbide epitaxial layer 2a and the second n-type silicon carbide epitaxial layer 2b collectively are the n-type silicon carbide epitaxial layer 2.

Next, on a surface of the second n-type silicon carbide epitaxial layer 2b, an ion implantation mask having predetermined openings is formed by photolithography, using, for example, an oxide film. Then, a p-type impurity such as aluminum is implanted in the openings of the oxide film, thereby forming upper first p$^+$-type base regions 4b of a depth of about 0.5 μm, the upper first p$^+$-type base regions 4b being formed so as to respectively overlap the lower first p$^+$-type base regions 4a. Regions respectively connecting the lower first p$^+$-type base regions 4a and the upper first p$^+$-type base regions 4b are formed, thereby forming the first p$^+$-type base regions 4. An impurity concentration of the upper first p$^+$-type base regions 4b is set to become, for example, about $5\times10^{18}/cm^3$.

Figure 8:
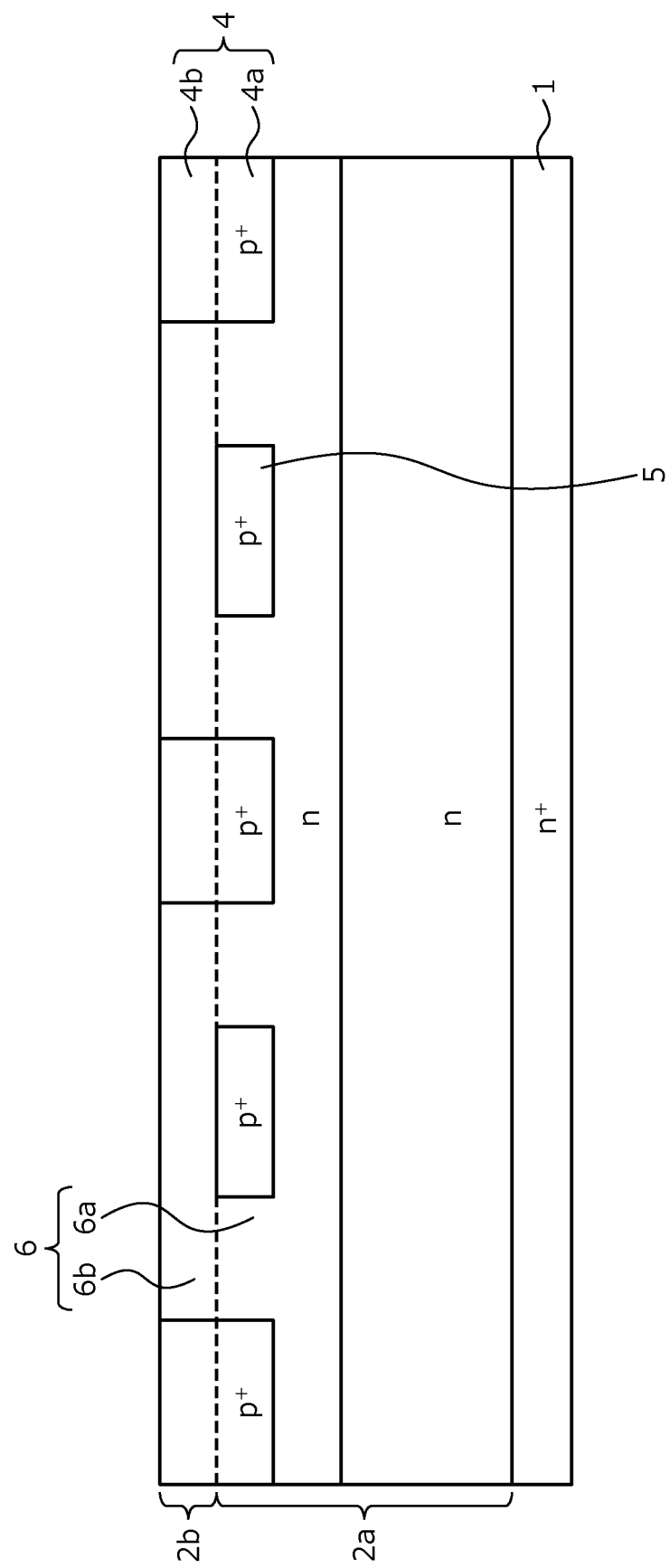
FIG. 8 is a cross-sectional view of the silicon carbide semiconductor device according to the embodiment during manufacture.

Next, portions of the ion implantation mask may be removed, an n-type impurity such as nitrogen may be ion-implanted in the openings, whereby upper n-type high-concentration regions 6b of a depth of, for example, about 0.5 μm may be formed in a portion of a surface region of the second silicon carbide epitaxial layer 2b. An impurity concentration of the upper n-type high-concentration regions 6b may be set to, for example, about $1\times10^{17}/cm^3$. The upper n-type high-concentration regions 6b and the lower n-type high-concentration region 6a are formed to at least partially contact one another and form the n-type high-concentration region 6. However, the n-type high-concentration region 6 may be formed on an entire surface of the substrate or may be omitted. The state up to here is depicted in FIG. 8.

Figure 9:
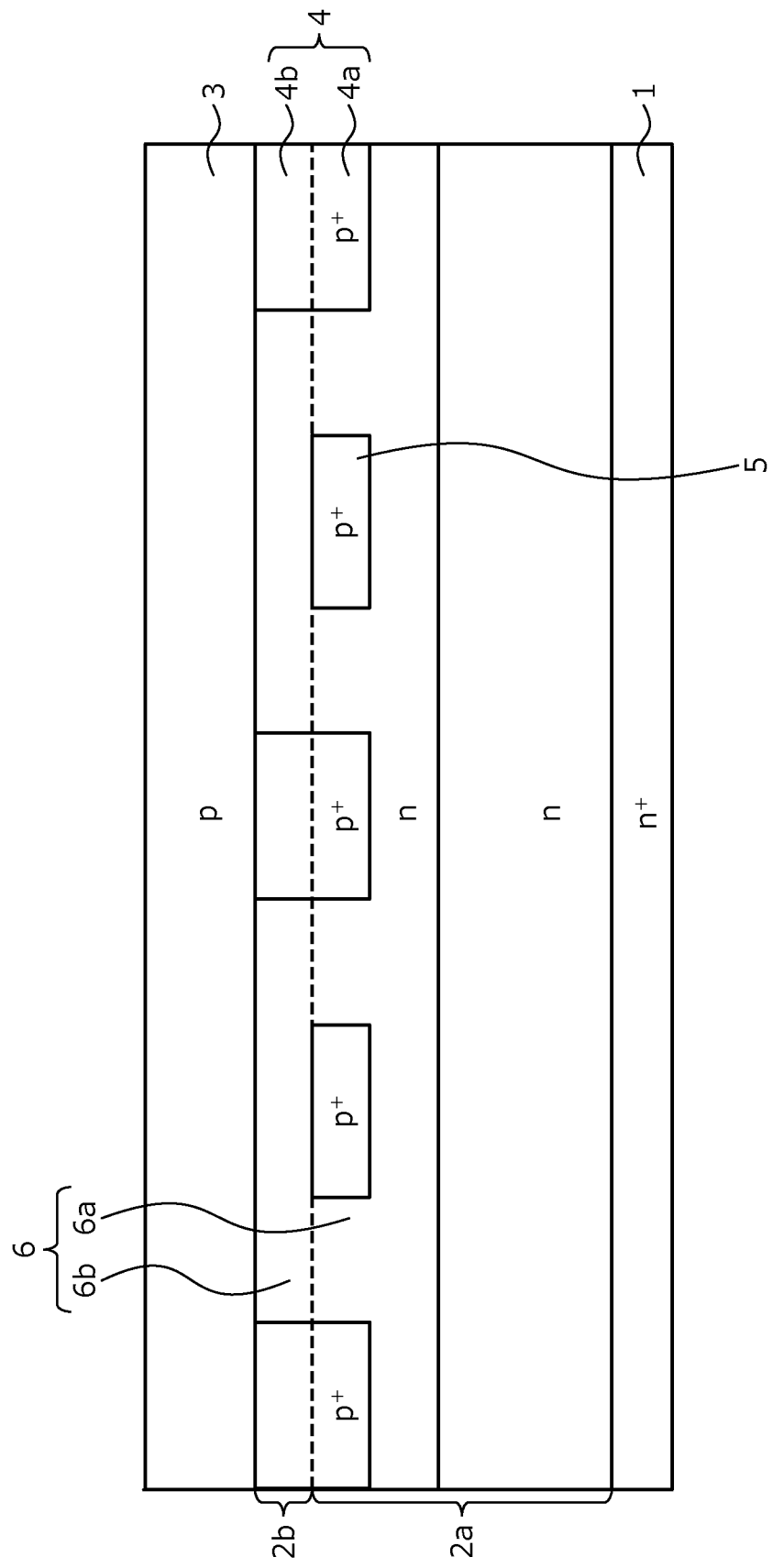
FIG. 9 is a cross-sectional view of the silicon carbide semiconductor device according to the embodiment during manufacture.

Next, on a surface of the n-type silicon carbide epitaxial layer 2, the p-type silicon carbide epitaxial layer 3 is formed to have a thickness of about 1.3 μm while a p-type impurity such as aluminum is doped. An impurity concentration of the p-type silicon carbide epitaxial layer 3 is set to be about $4\times10^{17}/cm^3$. The state up to here is depicted in FIG. 9.

Figure 10:
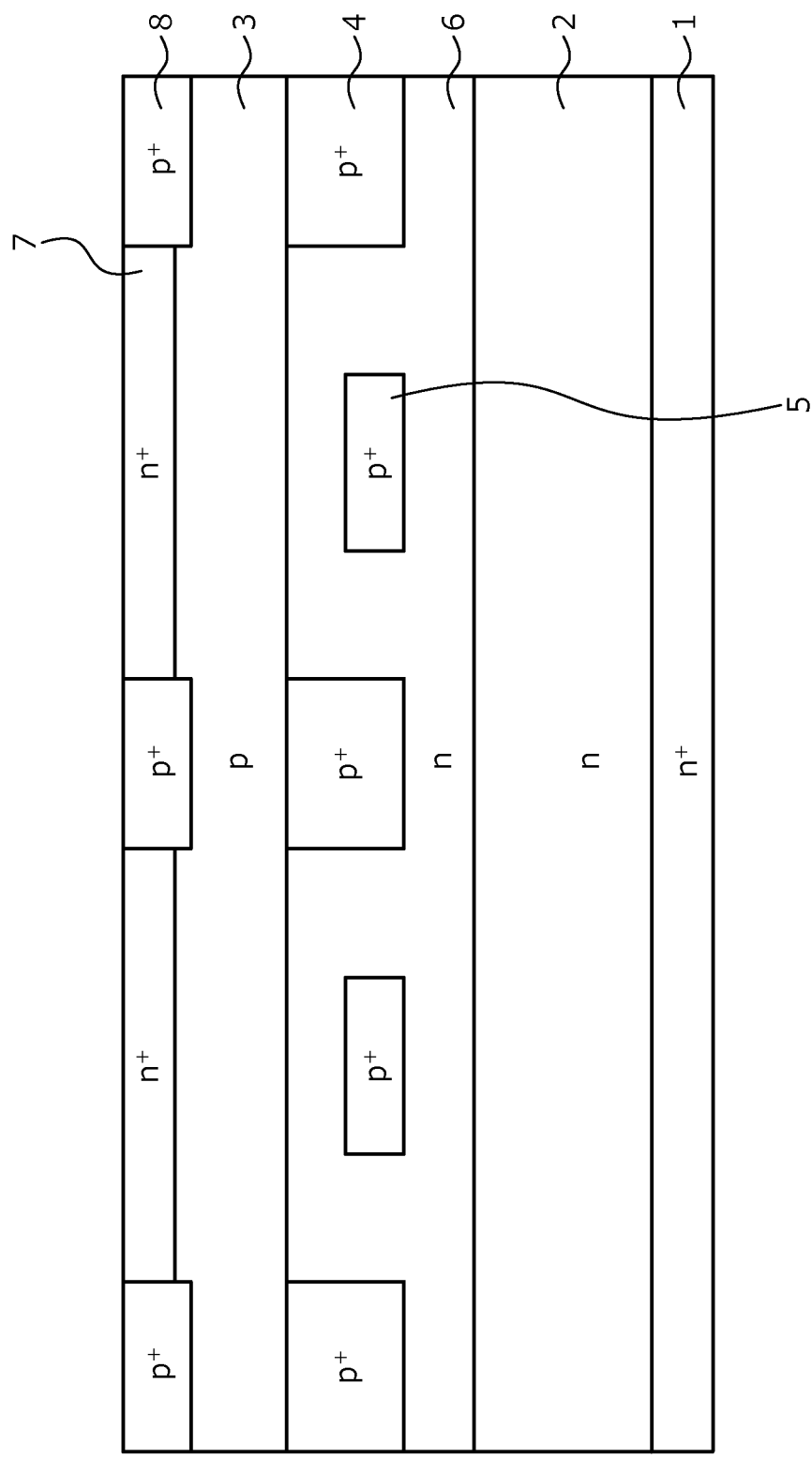
FIG. 10 is a cross-sectional view of the silicon carbide semiconductor device according to the embodiment during manufacture.

Next, on surfaces of the p-type silicon carbide epitaxial layer 3 and the exposed n-type silicon carbide epitaxial layer 2, an ion implantation mask having predetermined openings is formed by photolithography, using, for example, an oxide film. An n-type impurity such as phosphorus (P) is ion-implanted in the openings, thereby forming the n$^+$-type source regions 7 in portions of a surface of the p-type silicon carbide epitaxial layer 3. An impurity concentration of the n$^+$-type source regions 7 is set to be higher than the impurity concentration of the p-type silicon carbide epitaxial layer 3. Next, the ion implantation mask used in forming the n$^+$-type source regions 7 is removed, and by a similar method, an ion implantation mask having predetermined openings may be formed, a p-type impurity such as aluminum may be ion-implanted in portions of the surface of the p-type silicon carbide epitaxial layer 3, whereby the p$^+$-type contact regions 8 may be formed. An impurity concentration of the p$^+$-type contact regions 8 is set to be higher than the impurity concentration of the p-type silicon carbide epitaxial layer 3. The state up to here is depicted in FIG. 10.

Next, a heat treatment (annealing) in an inert gas atmosphere of about 1700 degrees C. is performed, thereby implementing an activation process of the first p$^+$-type base regions 4, the second p$^+$-type base regions 5, the n-type high-concentration region 6, the n$^+$-type source regions 7, and the p$^+$-type contact regions 8. As described, ion-implanted regions may be collectively activated by a single session of the heat treatment or may be activated by performing the heat treatment each time ion implantation is performed.

Figure 13:
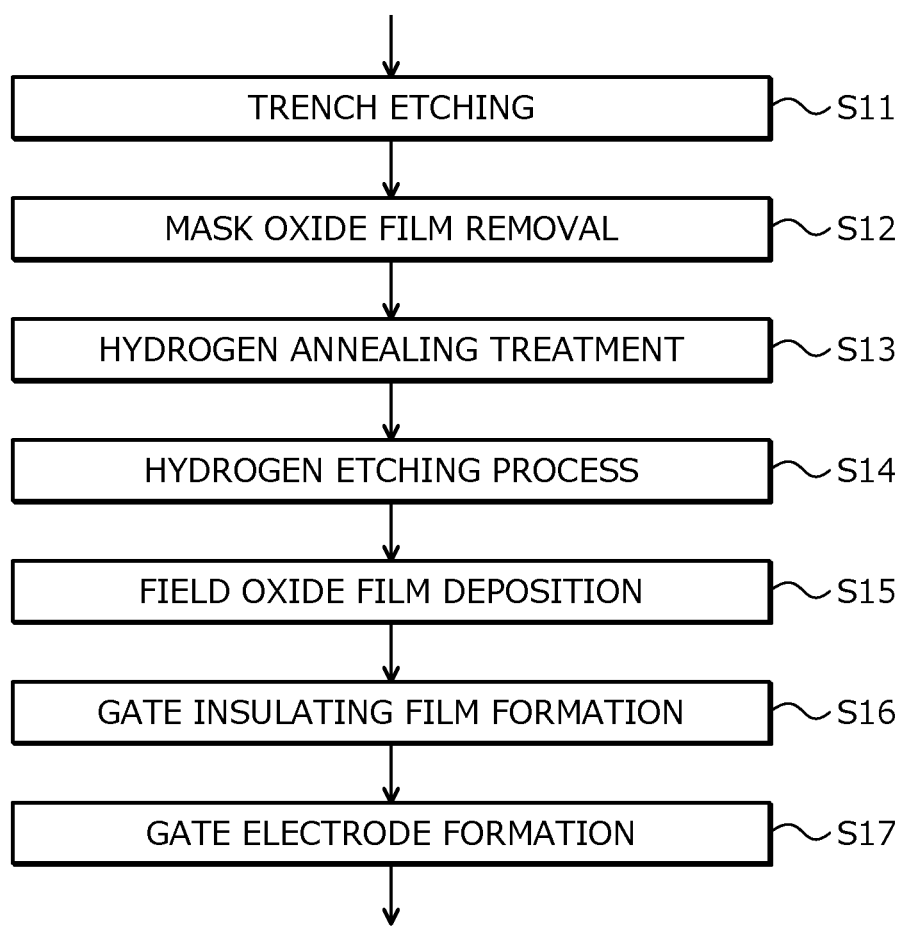
FIG. 13 is a flowchart depicting a method of forming trenches of the silicon carbide semiconductor device according to the embodiment.

FIG. 13 is a flowchart depicting a method of forming the trenches of the silicon carbide semiconductor device according to the embodiment. The trenches 18 of the embodiment are formed as follows. First, on the surface of the p-type silicon carbide epitaxial layer 3, a trench formation mask having predetermined openings is formed by photolithography using, for example, an oxide film. Next, by dry etching, the trenches 18 that penetrate the p-type silicon carbide epitaxial layer 3 and reach the n-type high-concentration region 6 (2) are formed (step S11). The bottoms of the trenches 18 may each reach a corresponding one of the second p$^+$-type base regions 5 formed in the n-type silicon carbide epitaxial layer 2. Next, the oxide film trench formation mask is removed (step S12).

Next, the hydrogen annealing treatment for rounding the bottoms of the trenches 18 and corners of corner portions of the trenches 18 is performed (step S13). The hydrogen annealing treatment is performed at a temperature of at least, for example, 1500 degrees C. As a result, the corner portions of the bottoms of the trenches 18 are embedded with silicon carbide, whereby the corners of the corner portions are rounded.

Next, the hydrogen etching process for removing the n-type region formed at each interface between the p-type silicon carbide epitaxial layer 3 and each of the trenches 18 is performed (step S14). The hydrogen etching process is performed for a certain time in a hydrogen atmosphere at a temperature of less than 1500 degrees C. The hydrogen etching process may be performed at a temperature in a range from 1300 degrees C. to less than 1500 degrees C., and may be performed at a temperature in a range from 1350 degrees C. to less than 1450 degrees C. For example, the hydrogen etching process is performed with a flow of hydrogen of 140 standard liters per minute (slm), a pressure of 11 kPa, and a temperature of 1400 degrees C. for 90 minutes. Similar effects were obtained with the pressure in a range from 4 kPa to 40 kPa. Further, a mixture of rare gases such as helium (He) may be used instead of 100% helium.

In this manner, in the embodiment, the hydrogen etching process is performed at a temperature lower than 1500 degrees C., whereby diffusion of silicon and carbon is suppressed and the surfaces of the trenches 18 are etched. As a result, a step is formed at the crystal surface and planarized. As a result, without use of a thermal oxide film, the n-type regions of the surfaces of the trenches 18 are removed, enabling suppression of leaks after rounding annealing and since excess carbon is not generated at the surfaces of the trenches 18, increases in channel resistance may be suppressed.

In a conventional method of manufacturing a trench, when a sacrificial oxide film is formed by thermal oxidation, silicon carbide is consumed, whereby the trench width increases. In contrast, in the embodiment, the thermal oxidation process is eliminated and therefore, the trench width may be reduced. For example, in the conventional method of manufacturing a trench by performing thermal oxidation plural times after hydrogen annealing of the trenches, the trench width is 0.88 µm; in the conventional method of manufacturing a trench by performing thermal oxidation one time, the trench width is 0.64 µm. On the other hand, in the embodiment, the hydrogen etching process is performed, and the trench width is 0.62 µm, which is narrower than the width of the trench formed by the conventional method of manufacturing a trench.

Figure 11:
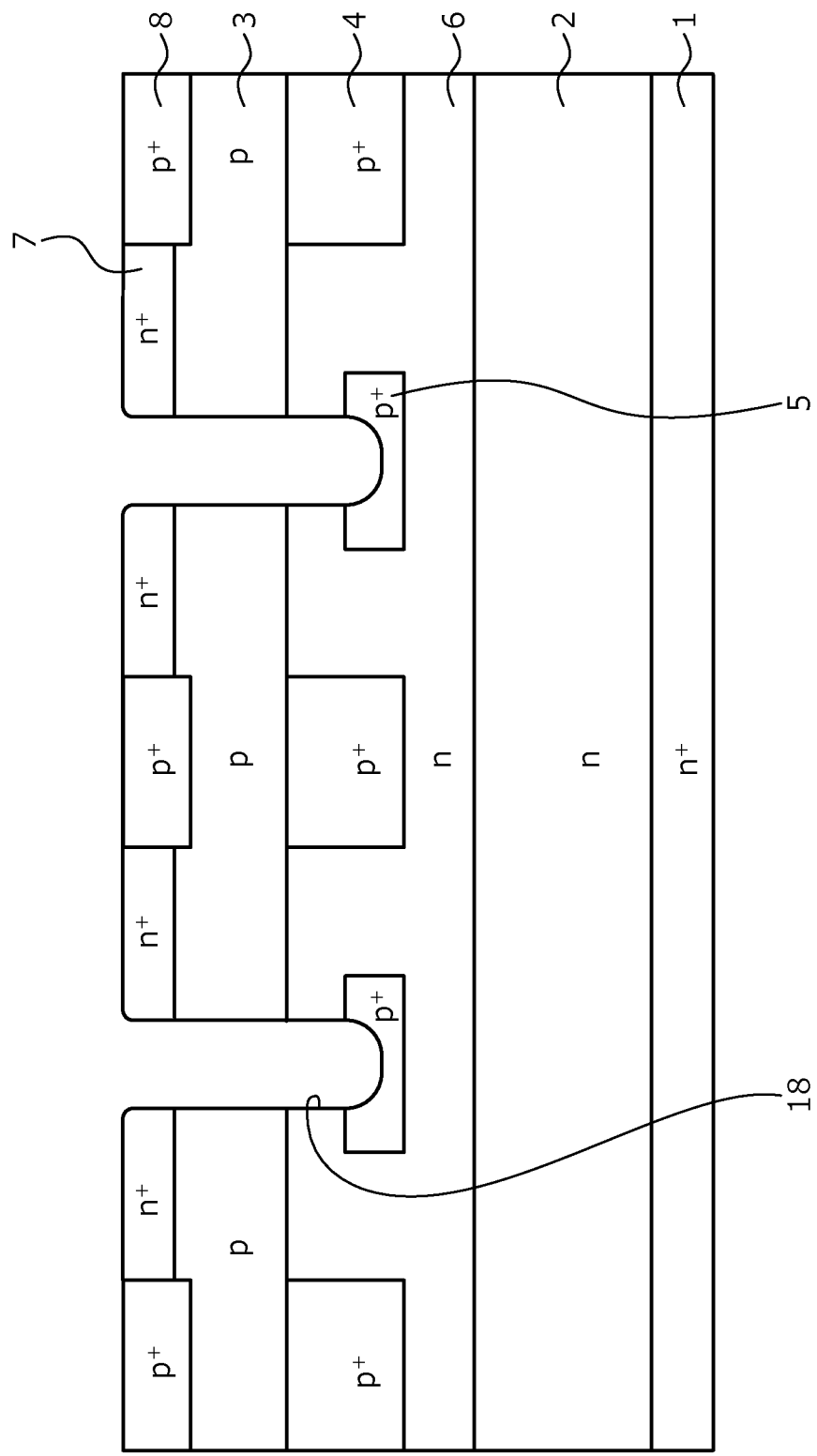
FIG. 11 is a cross-sectional view of the silicon carbide semiconductor device according to the embodiment during manufacture.

Next, along the front surface of the silicon carbide semiconductor base, a field oxide film is deposited to have a thickness of, for example, 0.5 µm (step S15). Next, an element structure is formed and an etching removal process is performed, thereby leaving the field oxide film in a portion of an edge termination region that sustains the breakdown voltage and surrounds a periphery of an active region through which current flows in an ON state. The state up to here is depicted in FIG. 11. FIG. 11 depicts only the structure of the active region and therefore, does not depict the field oxide film.

Next, the gate insulating film 9 is formed along surfaces of the n$^+$-type source regions 7 and along the bottoms and the side walls of the trenches 18 (step S16). In a case where the p$^+$-type contact regions 8 are formed, the gate insulating film 9 is further formed on the surfaces of the p$^+$-type contact regions 8. The gate insulating film 9 may be formed by a method of deposition by a chemical reaction such as that for a high temperature oxide (HTO). When the gate insulating film 9 is formed by a method of deposition such as that for a HTO, post deposition annealing (PDA) for reducing leak current and enhancing relative permittivity may be performed.

Next, on the gate insulating film 9, a polycrystalline silicon layer doped with, for example, phosphorus atoms is provided. The polycrystalline silicon layer may be formed so as to be embedded in the trenches 18. The polycrystalline silicon layer is patterned by photolithography and is left in the trenches 18, whereby the gate electrodes 10 are formed (step S17). A portion of each of the gate electrodes 10 may protrude outside the trenches 18. Thus, the flowchart depicted in FIG. 13 is completed, whereby the trenches of the embodiment are formed.

Figure 12:
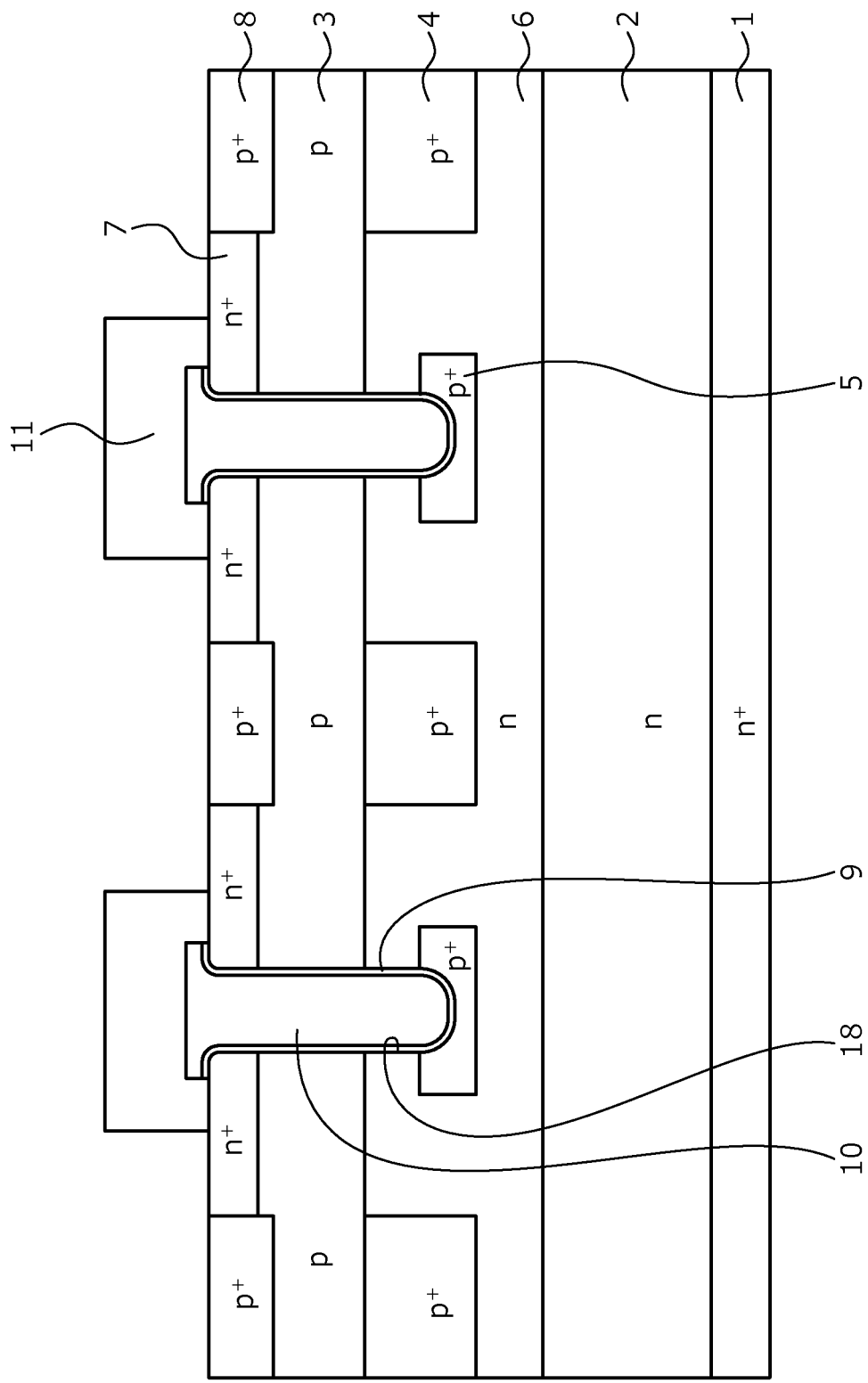
FIG. 12 is a cross-sectional view of the silicon carbide semiconductor device according to the embodiment during manufacture.

Next, for example, a phosphate glass is deposited to have a thickness of about 1 µm and to cover the gate insulating film 9 and the gate electrodes 10, thereby forming the interlayer insulating film 11. Next, a barrier metal (not depicted) containing titanium (Ti) or titanium nitride (TiN) may be formed so as to cover the interlayer insulating film 11. The interlayer insulating film 11 and the gate insulating film 9 are patterned by photolithography, thereby forming contact holes that expose the n+-type source regions 7. In a case where the p+-type contact regions 8 are formed, surfaces of the p+-type contact regions 8 are also exposed. Here, the gate electrodes have a stripe shape and therefore, the contact holes provided in the interlayer insulating film also have a stripe shape. Thereafter, a heat treatment (reflow) is performed, thereby planarizing the interlayer insulating film 11. The state up to here is depicted in FIG. 12.

Next, in the contact holes and on the interlayer insulating film 11, a conductive film of, for example, nickel (Ni) and forming the source electrodes 13 is provided. The conductive film is patterned by photolithography, leaving the source electrodes 13 only in the contact holes.

Next, on the second main surface of the n+-type silicon carbide semiconductor substrate 1, the back electrode 14 containing, for example, nickel is provided. Thereafter, a heat treatment in an inert gas atmosphere of about 1000 degrees C. is performed, thereby forming the source electrodes 13 and the back electrode 14 that form ohmic contacts with the n+-type source regions 7, the p+-type contact regions 8, and the n+-type silicon carbide semiconductor substrate 1.

Next, on the first main surface of the n+-type silicon carbide semiconductor substrate 1, an aluminum film having a thickness of about 5 μm is deposited by a sputtering technique, the aluminum film is removed by photolithography so that the source electrodes 13 and the interlayer insulating film 11 remain covered, thereby forming the source electrode pad 15.

Next, on a surface of the back electrode 14, for example, titanium (Ti), nickel, and gold (Au) are sequentially layered, whereby the drain electrode pad (not depicted) is formed. As described above, the silicon carbide semiconductor device depicted in FIG. 1 is completed.

As described above, according to the method of manufacturing the silicon carbide semiconductor device according to the embodiment, after the hydrogen annealing treatment, the hydrogen etching process is performed. As a result, at the interface between the gate insulating film and the silicon carbide semiconductor layer, a region where the rate of increase of oxygen in the interface section is greatest is closer to the gate insulating film than to the silicon carbide semiconductor layer. Further, without formation of a thermal oxide film, the n-type regions of the surfaces of the trenches are removed, enabling suppression of leaks after the rounding annealing and since excess carbon is not generated at the surfaces of the trenches, increases in channel resistance may be suppressed.

In the foregoing, as an example, while a case is described in which a main surface of the silicon carbide substrate containing silicon carbide is a (0001) plane and on the (0001) plane, a MOS is configured, without limitation hereto, various changes are possible such as regarding the wide bandgap semiconductor, orientation of the substrate main surface, etc.

Further, in the embodiment of the present invention, while a trench MOSFET has been described as an example, without limitation hereto, application is possible to semiconductor devices of various types of configurations such as MOS-type semiconductor devices like IGBTs having a trench structure. Further, as an example, in the embodiments described above, while a case is described in which silicon carbide is used as a wide bandgap semiconductor, similar effects are obtained in a case in which a wide bandgap semiconductor other than silicon carbide is used such as gallium nitride (GaN). Further, in the embodiments, while the first conductivity type is assumed to be an n-type and the second conductivity type is assumed to be a p-type, the present invention is similarly implemented when the first conductivity type is a p-type and the second conductivity type is an n-type.

As described above, after the hydrogen annealing treatment, the hydrogen etching process is performed. As a result, at the interface between the gate insulating film and the silicon carbide semiconductor layer, the region where the rate of increase of oxygen in the interface section is greatest is closer to the gate insulating film than to the silicon carbide semiconductor layer. Further, without formation of a thermal oxide film, the n-type regions of the surfaces of the trenches are removed, enabling suppression of leaks after the rounding annealing and since excess carbon is not generated at the surfaces of the trenches, increases in channel resistance may be suppressed.

The silicon carbide semiconductor device and the method of manufacturing a silicon carbide semiconductor device according to the present invention achieve an effect in that without increasing channel resistance, leaks after the rounding annealing may be suppressed.

As described, the silicon carbide semiconductor device and the method of manufacturing a silicon carbide semiconductor device according to the present invention are useful for high-voltage semiconductor devices used in power converting equipment and in power source devices such as those in various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:

a silicon carbide semiconductor substrate of a first conductivity type, having a front surface and a back surface opposite to the front surface;

a first silicon carbide semiconductor layer of the first conductivity type, provided on the front surface of the silicon carbide semiconductor substrate and having an impurity concentration that is lower than an impurity concentration of the silicon carbide semiconductor substrate, the first silicon carbide semiconductor layer having a first side and a second side opposite to the first side and facing the silicon carbide semiconductor substrate;

a second silicon carbide semiconductor layer of a second conductivity type, selectively provided on a surface of the first side of the first silicon carbide semiconductor layer, the second silicon carbide semiconductor layer having a first side and a second side opposite to the first side thereof and facing the silicon carbide semiconductor substrate, the second silicon carbide semiconductor layer further having a surface layer at the first side thereof;

a first silicon carbide semiconductor region of the first conductivity type, selectively provided in the surface layer of the second silicon carbide semiconductor layer;

a trench that penetrates the second silicon carbide semiconductor layer and the first silicon carbide semiconductor region, and reaches the first silicon carbide semiconductor layer;

a gate insulating film provided in the trench;

a gate electrode provided in the trench, on the gate insulating film;

an interlayer insulating film formed on the gate electrode;

a first electrode electrically connected to the first silicon carbide semiconductor region and the second silicon carbide semiconductor layer; and a second electrode provided at the back surface of the silicon carbide semiconductor substrate, wherein between the gate insulating film and any one among the first silicon carbide semiconductor layer, the second silicon carbide semiconductor layer, and the first silicon carbide semiconductor region is an interface section where a concentration of oxygen varies, the interface section having a region where a rate of increase of the oxygen included in the interface section is greatest, the region being closer to the gate insulating film than to the any one among the first silicon carbide semiconductor layer, the second silicon carbide semiconductor layer, and the first silicon carbide semiconductor region.

2. The silicon carbide semiconductor device according to claim 1, wherein a region portion where the rate of increase of the oxygen included in the interface section is increasing is larger than a region portion where the rate of increase of the oxygen is decreasing.

3. The silicon carbide semiconductor device according to claim 1, wherein the interface section has width that is at most 2 nm.

4. A method of manufacturing a silicon carbide semiconductor device, the method comprising:

forming a first silicon carbide semiconductor layer of a first conductivity type, on a front surface of a silicon carbide semiconductor substrate of the first conductivity type, the first silicon carbide semiconductor layer having an impurity concentration that is lower than an impurity concentration of the silicon carbide semiconductor substrate, the first silicon carbide semiconductor layer further having a first side and a second side opposite to the first side and facing the silicon carbide semiconductor substrate;

selectively forming a second silicon carbide semiconductor layer of a second conductivity type, on a surface of the first side of the first silicon carbide semiconductor layer, the second silicon carbide semiconductor layer having a first side and a second side opposite to the first side thereof and facing the silicon carbide semiconductor substrate;

selectively forming a first silicon carbide semiconductor region of the first conductivity type, in a surface layer of the first side the second silicon carbide semiconductor layer;

forming a trench that penetrates the second silicon carbide semiconductor layer and the first silicon carbide semiconductor region, and reaches the first silicon carbide semiconductor layer;

performing a hydrogen annealing treatment at a temperature of at least 1500 degrees C. to the trench;

performing a hydrogen etching process at a temperature in a range from 1300 degrees C. to less than 1500 degrees C., the hydrogen etching process being performed to the trench after the hydrogen annealing treatment;

forming a gate insulating film in the trench;

forming a gate electrode on the gate insulating film in the trench;

forming an interlayer insulating film that covers the gate electrode;

forming a first electrode that is electrically connected to the first silicon carbide semiconductor region and the second silicon carbide semiconductor layer; and forming a second electrode at a back surface of the silicon carbide semiconductor substrate.

* * * * *